(12) United States Patent
Chowdhury et al.

(10) Patent No.: US 8,853,792 B2
(45) Date of Patent: Oct. 7, 2014

(54) TRANSISTORS AND SEMICONDUCTOR DEVICES WITH OXYGEN-DIFFUSION BARRIER LAYERS

(75) Inventors: Murshed M. Chowdhury, Newburgh, NY (US); James K. Schaeffer, Wappingers Falls, NY (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/344,431

(22) Filed: Jan. 5, 2012

(65) Prior Publication Data

US 2012/0104515 A1    May 3, 2012

Related U.S. Application Data

(62) Division of application No. 12/568,412, filed on Sep. 28, 2009, now Pat. No. 8,114,739.

(51) Int. Cl.
*H01L 21/70* (2006.01)
*H01L 21/8238* (2006.01)
(Continued)

(52) U.S. Cl.
CPC *H01L 21/823807* (2013.01); *H01L 21/823857* (2013.01); *H01L 29/513* (2013.01); *H01L 29/518* (2013.01); *H01L 29/78* (2013.01); *H01L 29/4966* (2013.01); *H01L 27/0922* (2013.01); *H01L 21/823462* (2013.01)
USPC ........... 257/391; 257/392; 257/393; 257/395; 257/500; 257/635; 257/637; 257/E27.001; 257/E27.029; 257/E29.133; 257/E21.054; 438/176; 438/195; 438/197; 438/258; 438/279

(58) Field of Classification Search
CPC ............ H01L 21/823842; H01L 29/78; H01L 21/823807; H01L 27/088; H01L 29/49; H01L 29/51
USPC ......... 257/391–393, 395, 406, 410, 499, 500, 257/635, 637, 628, E27.001, E27.014, 257/E27.029, E27.046, E27.059, E27.06, 257/E29.133, E25.01, E21.054, E21.182, 257/E21.191, E21.207, E21.224, E21.149, 257/E21.532, E21.602, E21.625, E21.639; 438/57, 176, 195, 197, 200, 240, 258, 438/279, 283, 770, 778, 787
See application file for complete search history.

(56) References Cited

U.S. PATENT DOCUMENTS 5,773,335 A    6/1998 Chao
6,562,491 B1    5/2003 Jeon
(Continued)

FOREIGN PATENT DOCUMENTS

JP    2008288287 A    11/1996
JP    2000022139 A    1/2000
(Continued)

OTHER PUBLICATIONS

Cho, H.,et al., Structural and Electrical Properties of HfO2 with Top Nitrogen Incorporated Layer, IEEE Electron Device Letters, vol. 23, No. 5, May 2002.

*Primary Examiner* — Meiya Li
(74) *Attorney, Agent, or Firm* — Ingrassia Fisher & Lorenz, P.C.

(57) ABSTRACT

Embodiments of transistors comprise a gate stack overlying a semiconductor material. The gate stack comprises a deposited oxide layer overlying the semiconductor material, an oxygen-diffusion barrier layer overlying the deposited oxide layer, a high-k dielectric layer overlying the oxygen-diffusion barrier layer, and a conductive material (e.g., an oxygen-gettering conductive material) overlying the high-k dielectric layer. When the conductive material is an oxygen-gettering conductive material, the oxygen-diffusion barrier layer prevents diffusion of oxygen from the deposited oxide layer to the oxygen-gettering conductive material.

10 Claims, 6 Drawing Sheets

(51) Int. Cl.
*H01L 29/51* (2006.01)
*H01L 29/49* (2006.01)
*H01L 27/092* (2006.01)
*H01L 21/8234* (2006.01)
*H01L 29/78* (2006.01)

(56) References Cited

U.S. PATENT DOCUMENTS

| | | |
|---|---|---|
| 6,784,101 B1 | 8/2004 | Yu et al. |
| 6,911,707 B2 | 6/2005 | Gardner et al. |
| 2004/0058558 A1 | 3/2004 | Sakurai |
| 2005/0088889 A1 | 4/2005 | Lee et al. |
| 2005/0101134 A1 | 5/2005 | Brask et al. |
| 2006/0220106 A1* | 10/2006 | Choi et al. .................. 257/324 |
| 2007/0096226 A1 | 5/2007 | Liu et al. |
| 2009/0152651 A1 | 6/2009 | Bu et al. |
| 2010/0072535 A1* | 3/2010 | Takashima et al. ........... 257/324 |

FOREIGN PATENT DOCUMENTS

| | | |
|---|---|---|
| JP | 2002076347 A | 3/2002 |
| JP | 2004288885 A | 10/2004 |
| JP | 2007200946 A | 8/2007 |
| JP | 2007242968 A | 9/2007 |
| JP | 2007266230 A | 10/2007 |
| JP | 2008021935 A | 1/2008 |
| JP | 2009524239 A | 6/2009 |
| JP | 2010538496 A | 12/2010 |
| WO | 2009032411 A1 | 3/2009 |
| WO | 2009072421 A1 | 6/2009 |

* cited by examiner

TRANSISTORS AND SEMICONDUCTOR DEVICES WITH OXYGEN-DIFFUSION BARRIER LAYERS

RELATED APPLICATION

This application is a divisional of co-pending, U.S. patent application Ser. No. 12/568,412, filed on Sep. 28, 2009.

TECHNICAL FIELD

Embodiments of the subject matter described herein relate generally to semiconductor devices and methods for fabricating semiconductor devices, and more particularly, embodiments of the subject matter relate to methods for fabricating transistors with a gate stack having a layer of barrier material preventing oxygen diffusion from the gate oxide.

BACKGROUND

The majority of present day integrated circuits (ICs) are implemented by using a plurality of interconnected field effect transistors (FETs) realized as metal oxide semiconductor field effect transistors (MOSFETs or MOS transistors). A MOS transistor includes a gate electrode as a control electrode that is formed on a semiconductor substrate and spaced-apart source and drain regions formed within the semiconductor substrate and between which a current can flow. A control voltage applied to the gate electrode controls the flow of current through a channel in the semiconductor substrate between the source and drain regions beneath the gate electrode. The MOS transistor is accessed via conductive contacts formed on the source and drain regions.

Some ICs are formed using both P-channel FETs (PMOS transistors) and N-channel FETs (NMOS transistors), referred to as a complementary MOS or CMOS integrated circuit. Often, the IC will include transistors which interface with other electrical components outside the IC (i.e., the input/output (or I/O) transistors) as well as transistors that implement the internal logic functionality for the IC (i.e., the logic transistors). The I/O transistors typically operate at higher voltage levels than the logic transistors, and as a result, the I/O transistors often utilize a thick gate oxide. When the channel of the I/O transistor comprises material, such as silicon germanium (SiGe) or silicon carbide (SiC), the gate oxide may be formed by depositing an oxide to the desired thickness. Deposited oxide could be sub-stoichiometric and contain impurities and/or broken bonds. As a result, when an oxygen-gettering material is used in the gate-stack, oxygen from the deposited oxide is more likely to diffuse to the oxygen-gettering material during subsequent high temperature process steps. This results in non-uniform gate oxide thickness, increased gate leakage, degraded time-dependent dielectric breakdown (TDDB), and variation in threshold voltage for the I/O transistors.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-8 illustrate, in cross section, methods for fabricating a CMOS semiconductor device in accordance with exemplary embodiments. Although the subject matter is described herein in the context of a CMOS semiconductor device, the subject matter is not intended to be limited to CMOS semiconductor devices, and may be utilized with other MOS semiconductor devices which are not CMOS semiconductor devices. Various steps in the manufacture of MOS components are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
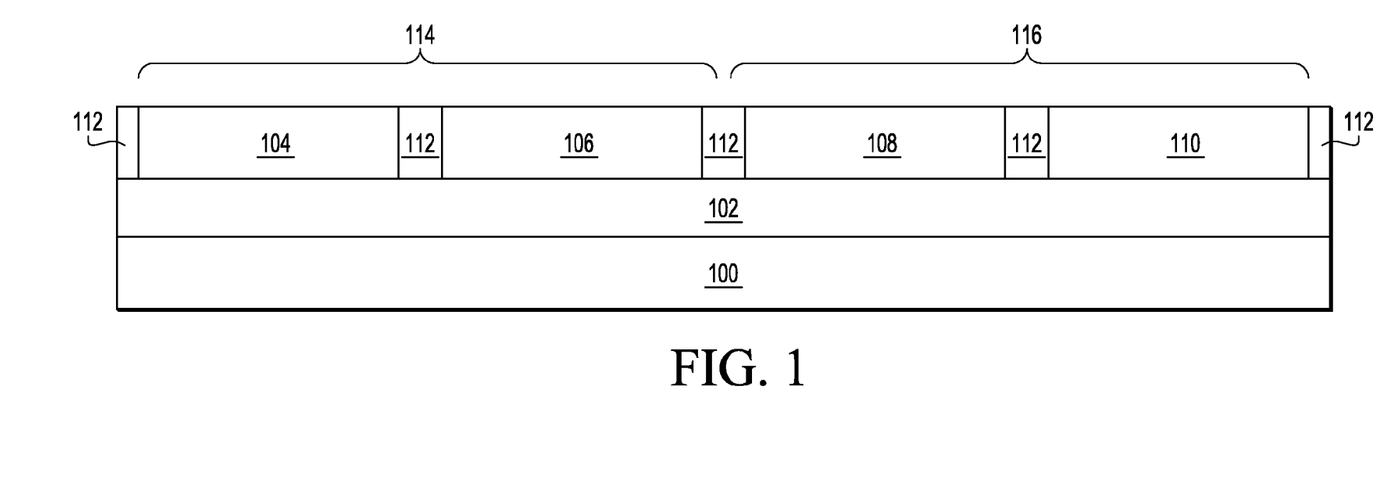
FIGS. 1-8 illustrate, in cross section, a CMOS semiconductor device structure and exemplary methods for fabricating the CMOS semiconductor device in accordance with one embodiment of the invention.

Referring to FIG. 1, the illustrated fabrication process begins by providing an appropriate semiconductor substrate and forming electrically isolated regions 104, 106, 108, 110 of semiconductor material. In the illustrated embodiment, the semiconductor substrate is realized as silicon-on-insulator (SOI) substrate having a support layer 100, a layer of insulating material 102 on the support layer 100, and a layer of semiconductor material on the layer of insulating material 102. In this regard, FIG. 1 depicts the semiconductor device structure after electrically isolating regions 104, 106, 108, 110 of the layer of semiconductor material, as described in greater detail below. In accordance with one embodiment, the insulating material 102 is realized as an oxide layer formed in a subsurface region of the semiconductor substrate, also known as a buried oxide (BOX) layer. For example, the layer of insulating material 102 may be formed by an ion implantation process followed by high temperature annealing to create a buried layer of silicon dioxide. In other embodiments, an oxidized wafer may be bonded to the support layer 100 from a donor wafer to obtain the layer of insulating material 102 between the support layer 100 and a layer of semiconductor material overlying the layer of insulating material 102. It should be understood that the fabrication process described herein is not constrained by the dimensions of the semiconductor material of the electrically isolated regions 104, 106, 108, 110 or the insulating material 102. Further, it should be appreciated that the fabrication process described below may also be used to create devices from a bulk semiconductor substrate. In an exemplary embodiment, the layer of semiconductor material of the electrically isolated regions 104, 106, 108, 110 overlying the insulating layer 102 comprises a silicon material, wherein the term "silicon material" is used herein to encompass the relatively pure silicon materials typically used in the semiconductor industry as well as silicon admixed with other elements such as germanium, carbon, and the like. Alternatively, the semiconductor material of the electrically isolated regions 104, 106, 108, 110 can be realized as germanium, gallium arsenide, and the like, or the semiconductor material of the electrically isolated regions 104, 106, 108, 110 can include layers of different semiconductor materials.

Depending on the embodiment, the electrically isolated regions 104, 106, 108, 110 may be formed by shallow trench isolation (STI), local oxidation of silicon (LOCOS), or another suitable process known in the art. In accordance with one embodiment, the regions 104, 106, 108, 110 are formed by performing shallow trench isolation on the semiconductor substrate by etching trenches into the surface of the semiconductor material and forming a layer of insulating material 112 in the trenches. In an exemplary embodiment, the trenches are etched to a depth at least equal to the thickness of the layer of semiconductor material of the electrically isolated regions 104, 106, 108, 110 overlying the insulating layer 102, and a layer of oxide is formed in the trench, known as the field oxide. The insulating material 112 may hereinafter be referred to for convenience, but without limitation, as the field oxide. In an exemplary embodiment, the isolated regions 104, 106, 108, 110 are implanted with ions to achieve a desired dopant profile. For example, a layer of photoresist may be applied and patterned to mask the first and third electrically isolated regions 104, 108 and an N-well may be formed in the second and fourth electrically isolated regions 106, 110 by implanting arsenic and/or phosphorus ions into the regions 106, 110. The layer of photoresist masking the first and third regions 104, 108 may be removed, and another layer of photoresist applied and patterned to mask the second and fourth regions 106, 110 and a P-well may be formed in the regions 104, 108 by implanting the first and third regions 104, 108 with boron ions while masking the second and fourth regions 106, 110. The layer of photoresist masking the second and fourth regions 106, 110 is removed and the semiconductor substrate is heated to activate the implants. These ion implantation steps may include several different, separate implantations at different energies and different doses to achieve a desired doping profile, as will be appreciated in the art.

Although one or more additional process steps may be performed next, in an exemplary embodiment, the fabrication of the CMOS semiconductor device continues by forming input/output (I/O) transistor structures on the first and second regions 104, 106 (collectively referred to herein as the I/O transistor region 114) and logic transistor structures on the third and fourth regions 108, 110 (collectively referred to herein as the logic transistor region 116). In this regard, in an exemplary embodiment, the I/O transistor region 114 includes a P-well in the first region 104 for forming an NMOS I/O transistor and an N-well in the second region 106 for forming a PMOS I/O transistor. Similarly, the logic transistor region 116 includes a P-well region in the third region 108 for forming an NMOS logic transistor and an N-well in the fourth region 110 for forming a PMOS logic transistor. In an exemplary embodiment, as described in greater detail below, the I/O transistors are realized as thick oxide devices and the logic transistors are realized as thin oxide devices, that is, the gate stacks of the I/O transistors include a layer of an oxide material that is thicker than a corresponding layer of oxide material in the gate stacks of the logic transistors.

Figure 2:
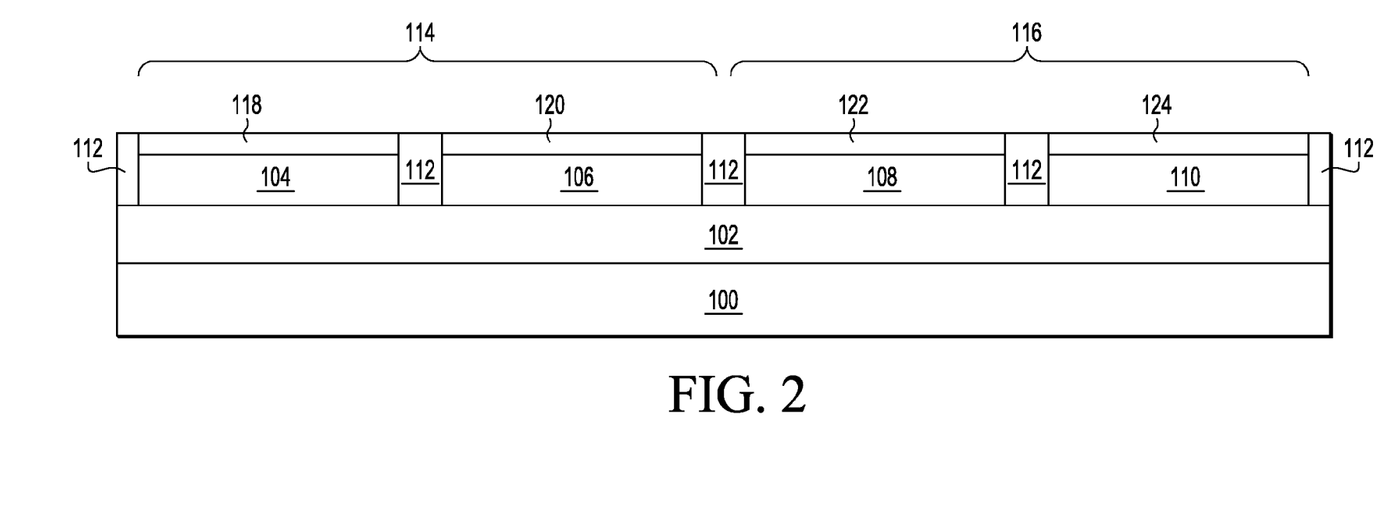

Referring to FIG. 2, in an exemplary embodiment, the fabrication process continues by forming regions 118, 120, 122, 124 of mobility-enhancing material in the semiconductor material of the electrically isolated regions 104, 106, 108, 110. It should be noted that FIG. 2 depicts the mobility-enhancing material regions 118, 120, 122, 124 being formed in both the P-well regions 104, 108 and the N-well regions 106, 110 for purposes of explanation. In practice, the mobility-enhancing material regions 120, 124 may be formed only in the N-well regions 106, 110, in other words, the mobility-enhancing material may be used only for the PMOS transistors. In addition, the mobility-enhancing material may occupy only a portion of a respective region of semiconductor material, as will be appreciated in the art. In this regard, in an exemplary embodiment, at least a portion of the channel of the subsequently formed PMOS I/O transistor comprises a mobility-enhancing material 120.

In accordance with one embodiment, the mobility-enhancing material regions 118, 120, 122, 124 may be formed by forming cavities in the layer of semiconductor material of the electrically isolated regions 104, 106, 108, 110 and forming the mobility-enhancing material in the cavities. For example, cavities may be formed in regions 104, 106, 108, 110 by etching the layer of semiconductor material using the field oxide 112 as an etch mask by performing plasma-based RIE (reactive ion etching), using commonly known etchant chemistries, which have the advantage of etching silicon with good selectivity to the exposed field oxide region 112. In an exemplary embodiment, the cavities are formed having a depth relative to the surface of the semiconductor material less than the thickness of the semiconductor material of the regions 104, 106, 108, 110 such that the underlying insulating material 102 is not exposed. The mobility-enhancing material regions 118, 120, 122, 124 may be formed by growing a crystalline material having a different lattice constant than the host semiconductor material on the exposed surface of the semiconductor material of regions 104, 106, 108, 110 (e.g., the exposed surfaces bordering the cavities). In an exemplary embodiment, the mobility-enhancing material of regions 118, 120, 122, 124 is epitaxially grown over the semiconductor material 104, 106, 108, 110. In an exemplary embodiment, the P-well regions 104, 108 are masked to prevent epitaxial growth on the surface of the cavities in the P-well regions 104, 108 and a mobility-enhancing material, such as silicon germanium, may be grown to at least the thickness of the cavities (e.g., a "flush" fill or slight overfill) in the N-well regions 106, 110 to form embedded silicon germanium regions 120, 124. The embedded silicon germanium regions 120, 124 are compressively stressed and will form the channel region of subsequently formed PMOS transistors. The compressively stressed silicon germanium increases the mobility of holes in the channel, as will be appreciated in the art. Similarly, for a the P-well regions 104, 108, the N-well regions 106, 110 may be masked and a mobility-enhancing material, such as monocrystalline carbon silicon, may be grown to form embedded regions 118, 122 which possess tensile stress and increase the mobility of electrons in the channel, as will be appreciated in the art. In accordance with another embodiment, the mobility-enhancing material regions 118, 120, 122, 124 are formed by performing a chemical wet clean of the surface of the semiconductor device structure of FIG. 1 and then forming the mobility-enhancing material regions 118, 120, 122, 124 on top of the semiconductor material of the regions 104, 106, 108, 110.

Figure 3:
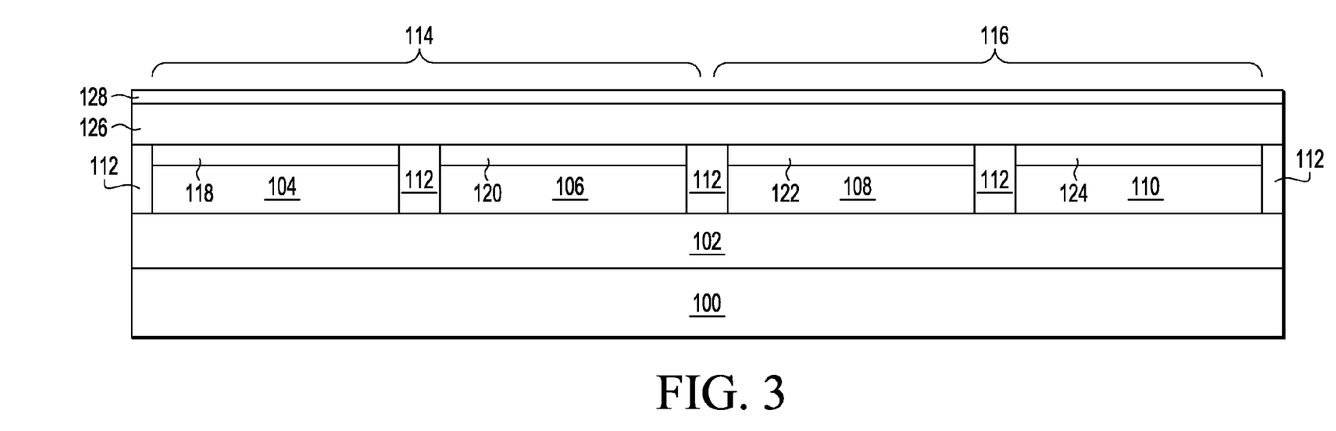

Referring now to FIG. 3, in an exemplary embodiment, the fabrication process continues by forming an oxide layer 126 overlying the electrically isolated regions 104, 106, 108, 110 and the field oxide 112. In an exemplary embodiment, the oxide layer 126 comprises an oxide material having a thickness ranging from about 1 nanometer (nm) to about 7 nm. In this regard, the oxide layer 126 will form a thick gate oxide for subsequently formed I/O transistors overlying the first and second regions 104, 106, as described in greater detail below.

In an exemplary embodiment, the oxide layer 126 is formed by depositing a layer of an oxide material overlying the exposed regions 104, 106, 108, 110 and the field oxide 112. For example, a layer of silicon dioxide may be conformally deposited overlying regions 104, 106, 108, 110 and the field oxide 112 by chemical vapor deposition (CVD), plasma-enhanced chemical vapor deposition (PECVD), or atomic layer deposition (ALD). The oxide layer 126 is preferably deposited at a temperature between about 700° C. to about 1000° C., and preferably, is deposited at about 750° C. The oxide layer 126 is deposited on the mobility-enhancing material 118, 120, 122, 124 because thermally growing the oxide material to the desired thickness for the I/O transistor region 114 (e.g., greater than about 1 nm) would undesirably consume silicon from the mobility-enhancing material regions 118, 120, 122, 124 and result in the mobility-enhancing material regions 118, 120, 122, 124 being silicon deficient. In addition, when the mobility-enhancing material regions 120, 124 are realized as silicon germanium, thermal oxidation results in the formation of germanium oxide and undesirable diffusion of germanium during subsequent process steps.

In an exemplary embodiment, the fabrication process continues by forming an oxygen-diffusion barrier layer 128 overlying the oxide layer 126. The oxygen-diffusion barrier layer 128 provides a barrier to the diffusion of oxygen from the oxide layer 126 to an oxygen-gettering material subsequently formed overlying the oxygen-diffusion barrier layer 128, as described in greater detail below. In an exemplary embodiment, the oxygen-diffusion barrier layer 128 is formed by conformally depositing a layer of a barrier material overlying the oxide layer 126 by CVD, PECVD, or ALD in a conventional manner. Depending on the embodiment, the barrier material may be realized as silicon nitride ($Si_3N_4$), aluminum nitride (AlN), or germanium nitride ($Ge_3N_4$). In an exemplary embodiment, the oxygen-diffusion barrier layer 128 has a thickness ranging from about 0.1 nm (1 Angstrom) to about 1.5 nm.

Figure 4:
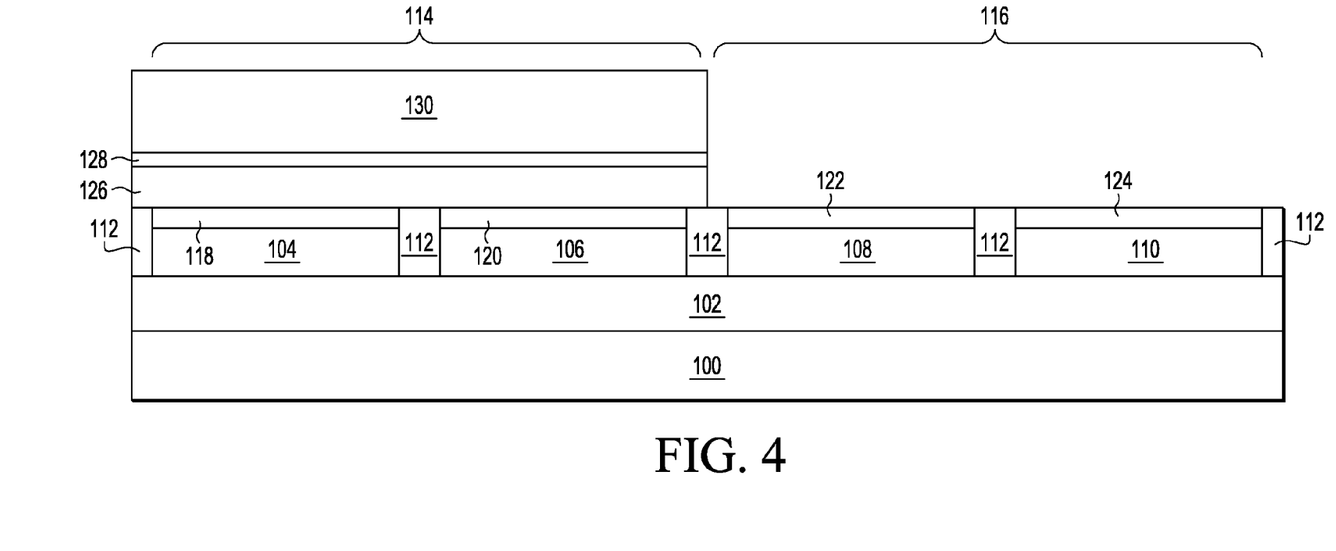

Referring to FIG. 4, in an exemplary embodiment, the fabrication process continues by selectively removing the oxide layer 126 and oxygen-diffusion barrier layer 128 overlying the logic transistor region 116. A layer of photoresist 130 may be applied and patterned to mask the I/O transistor region 114, that is, regions 104, 106 and at least part of the field oxide 112 between region 106 and region 108. The fabrication process continues by selectively removing the oxide layer 126 and oxygen-diffusion barrier layer 128 from the logic transistor region 116 by etching the oxide layer 126 and oxygen-diffusion barrier layer 128 using the patterned layer of photoresist 130 as an etch mask, resulting in the semiconductor device structure shown in FIG. 4. Depending on the embodiment, the layers 126, 128 may be removed as part of a single etch step, or alternatively, a separate etchant may be used to remove each layer 126, 128 individually. After removing the oxide layer 126 and oxygen-diffusion barrier layer 128 overlying the logic transistor region 116, the photoresist 130 is removed from the I/O transistor region 114.

Figure 5:
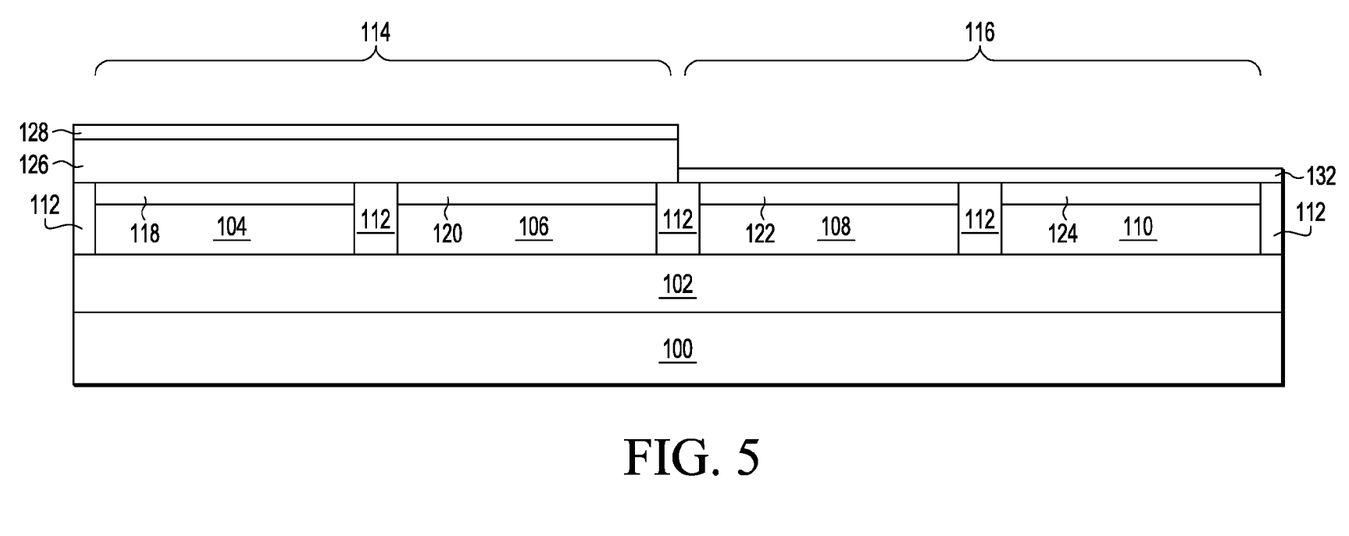

Referring now to FIG. 5, in an exemplary embodiment, the fabrication process continues by forming an interfacial layer 132 overlying the logic transistor region 116. In an exemplary embodiment, the interfacial layer 132 comprises an oxide material (or another suitable dielectric material) having a thickness less than that of the oxide layer 126. Accordingly, the interfacial layer 132 may alternatively be referred to herein as the thin oxide layer while the deposited oxide layer 126 may alternatively be referred to herein as the thick oxide layer. In an exemplary embodiment, the interfacial layer 132 is formed by growing a thin layer of an oxide material by performing a chemical clean of the surface of the semiconductor device structure using an oxidizing substance, such as hydrogen peroxide or ammonium peroxide, which grows a thin layer of an oxide material on the exposed surfaces of the isolated regions 108, 110, resulting in the semiconductor device structure of FIG. 5. In this regard, it will be appreciated in the art that the thickness of the chemically grown oxide material is limited, and as a result, the interfacial layer 132 typically has a thickness of about 1 nm or less. However, the thickness of the interfacial layer 132 is adequate for the logic transistor region 116 and is grown without depleting the silicon of the mobility-enhancing material 122, 124 or forming germanium oxide. It should be noted that although not depicted in FIG. 5, in practice, a negligibly thin layer of oxide material may also grow on exposed surfaces of the oxygen-diffusion barrier layer 128 during the chemical clean. In alternative embodiments, the thin oxide layer 132 may be thermally grown by performing a field oxidation process and exposing the semiconductor device structure to an oxidizing ambient in an elevated temperature that promotes selective growth of oxide material at the exposed surfaces of the semiconductor material 122, 124, as will be appreciated in the art. In an exemplary embodiment, after growing the oxide material on the exposed surfaces of the semiconductor material 122, 124, the fabrication process continues by performing a low temperature nitration process, such as pulsed-RF decoupled plasma nitration (DPN), such that the interfacial layer 132 is realized as nitrided oxide.

Figure 6:
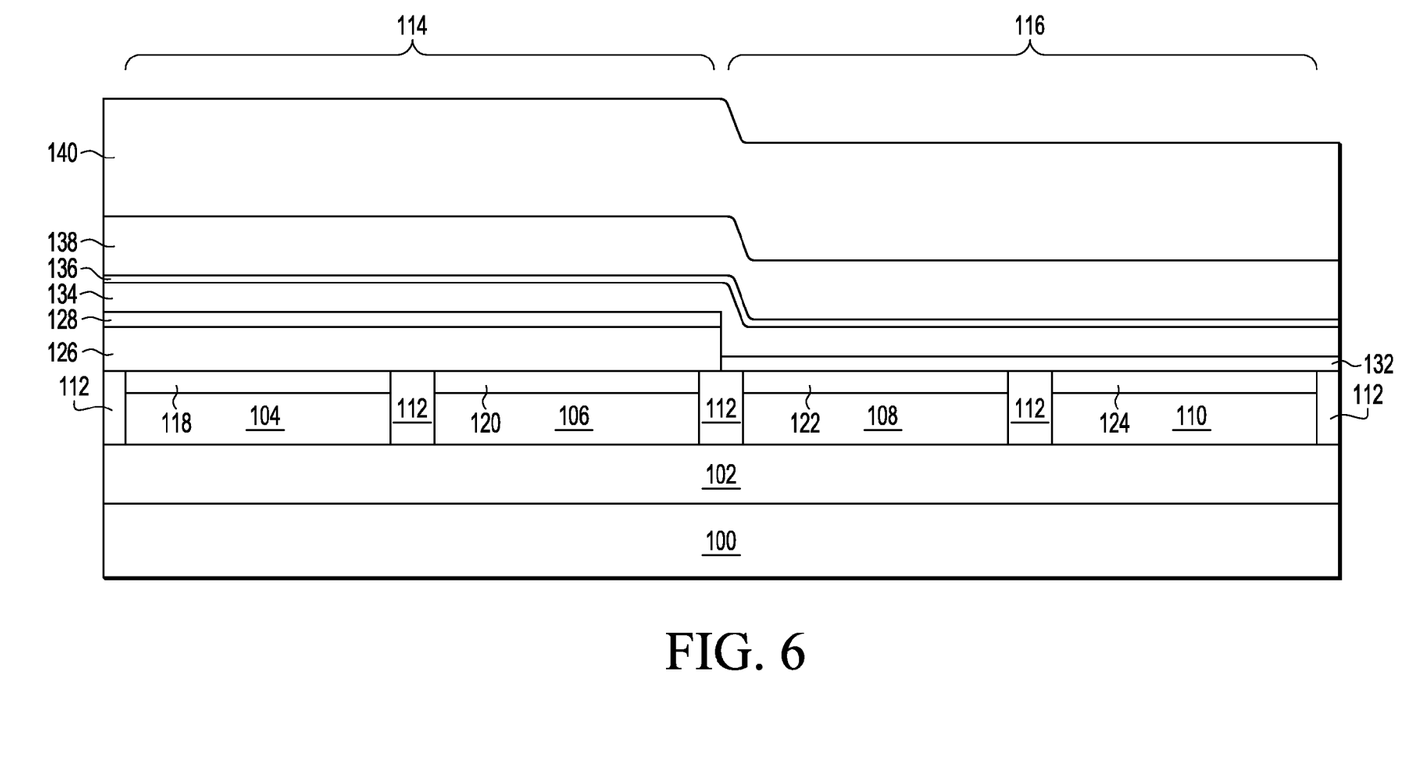

Referring now to FIG. 6, in an exemplary embodiment, the fabrication process continues by forming a high-k dielectric layer 134 comprising a high-k dielectric material overlying the oxygen-diffusion barrier layer 128 on the I/O transistor region 114 and the interfacial layer 132 on the logic transistor region 116. The high-k dielectric material is realized as a material having a dielectric constant greater than that of silicon dioxide, such as, for example, hafnium dioxide ($HfO_2$), hafnium silicon oxynitride (HfSiON), molecular hafnium zirconium dioxide ($Hf_xZr_xO_2$), tantalum oxide ($Ta_2O_5$), or yttrium oxide ($Y_2O_3$). In an exemplary embodiment, high-k dielectric layer 134 is conformally deposited overlying the oxygen-diffusion barrier layer 128 and the interfacial layer 132 by CVD, PECVD, or ALD in a conventional manner. Depending on the embodiment, the thickness of the high-k dielectric layer 134 may range from about 1 nm to about 3 nm.

In an exemplary embodiment, after forming the high-k dielectric layer 134, the fabrication process continues by forming a capping layer 136 overlying the high-k dielectric layer 134. In an exemplary embodiment, the capping layer 136 is formed by conformally depositing a layer of a capping material overlying the high-k dielectric layer 134 by CVD, PECVD, or ALD in a conventional manner. Depending on the embodiment, the capping material may be realized as a rare earth oxide, such as lanthanum oxide ($La_2O_3$), or a metal oxide, such as aluminum oxide ($Al_2O_3$). In an exemplary embodiment, the thickness of the capping layer 136 may range from about 0.1 nm to about 1 nm.

In an exemplary embodiment, after forming the capping layer 136, the fabrication process continues by forming a conductive layer 138 comprising an oxygen-gettering conductive material overlying the capping layer 136. An oxygen-gettering conductive material is a conductive material that has a chemical affinity to scavenge oxygen away from other materials or from the ambient. In this regard, due to impurities and/or broken bonds within the deposited oxide material of the thick oxide layer 126, in the absence of the oxygen-diffusion barrier layer 128, oxygen molecules from the thick oxide layer 126 would tend to diffuse through the high-k dielectric layer 134 and/or capping layer 136 to the oxygen-gettering conductive layer 138 during subsequent process steps. For example, in the absence of the oxygen-diffusion barrier layer 128, oxygen molecules from the oxide layer 126 may diffuse to the oxygen-gettering conductive layer 138 during subsequent high temperature process steps, such as thermal annealing for source-drain activation. Thus, the oxygen-diffusion barrier layer 128 prevents diffusion of oxygen from the deposited oxide layer 126 to the oxygen-gettering conductive layer 138.

In an exemplary embodiment, the oxygen-gettering conductive layer 138 is formed by conformally depositing an oxygen-gettering metal layer overlying the capping layer 136 by CVD, PECVD, or ALD in a conventional manner. Depending on the embodiment, the oxygen-gettering metal layer may be realized as titanium nitride (TiN), tantalum nitride (TaN), tungsten nitride (WN) or another metal nitride. The oxygen-gettering conductive metal layer is utilized to reduce the threshold voltage of the subsequently formed transistors, as will be appreciated in the art. In an exemplary embodiment, the thickness of the oxygen-gettering conductive layer 138 is about 1.5 nm, however in practical embodiments, the thickness of the oxygen-gettering conductive layer 138 may range from about 0.5 nm to about 10 nm. After forming the conductive layer 138, in an exemplary embodiment, the fabrication process continues by forming a gate electrode layer 140 comprising a layer of gate electrode material overlying the conductive layer 138. In accordance with one embodiment, the gate electrode layer 140 comprises polycrystalline silicon conformally deposited overlying the conductive layer 138 in a conventional manner.

Figure 7:
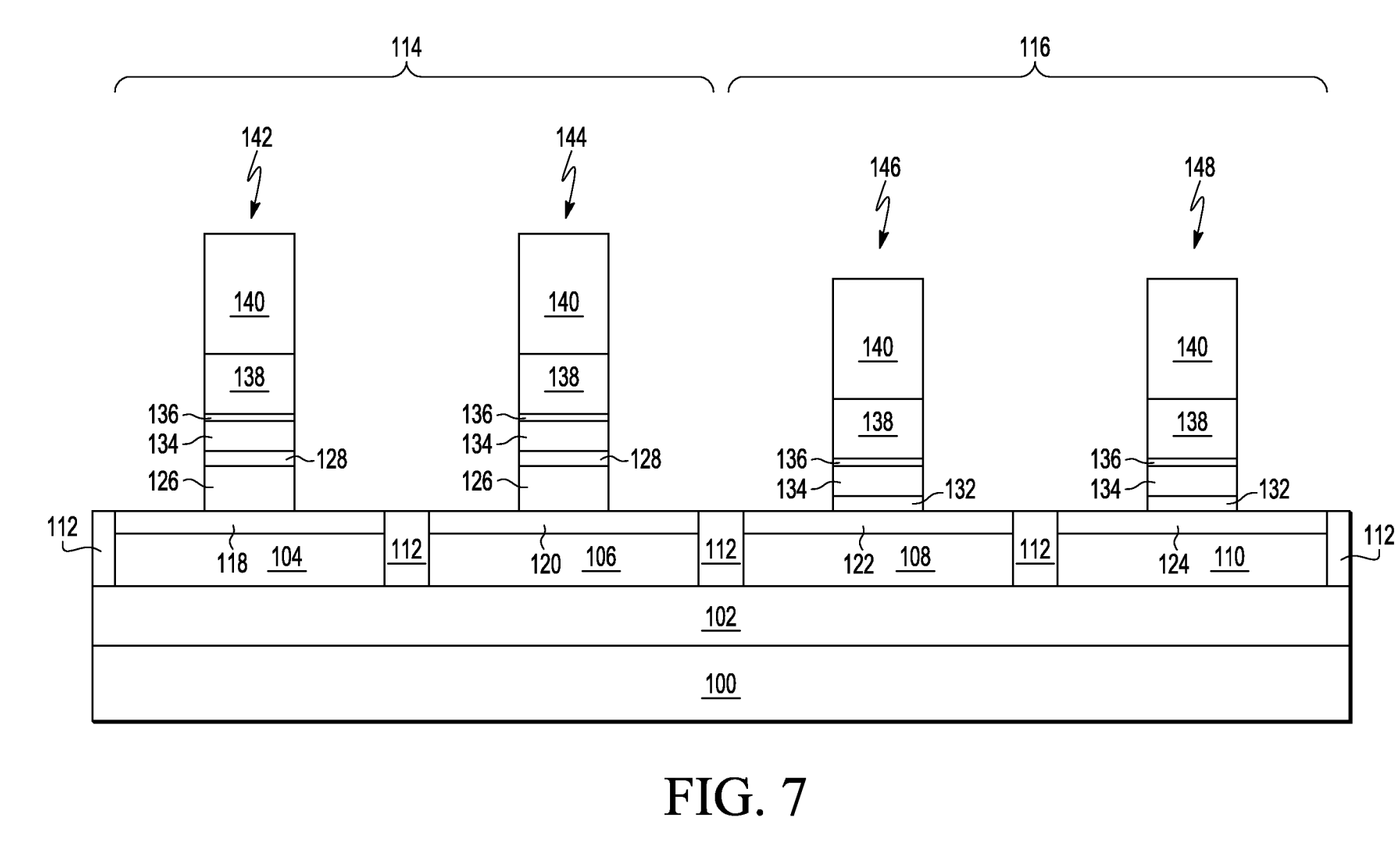

Referring now to FIG. 7, in an exemplary embodiment, the fabrication process continues by selectively removing the gate electrode layer 140, the oxygen-gettering conductive layer 138, the capping layer 136, the high-k dielectric layer 134 the barrier layer 128, and the oxide layer 126 from the I/O transistor region 114 to form gate stacks 142, 144 and selectively removing the gate electrode layer 140, the oxygen-gettering conductive layer 138, the capping layer 136, the high-k dielectric layer 134, and the interfacial layer 132 from the logic transistor region 116 to form gate stacks 146, 148. In this regard, in an exemplary embodiment, the gate electrode layer 140, the oxygen-gettering conductive layer 138, the capping layer 136, the high-k dielectric layer 134, the interfacial layer 132, the barrier layer 128, and the oxide layer 126 are patterned and etched in a conventional manner to form gate stacks 142, 144, 146, 148 overlying the respective transistor regions 104, 106, 108, 110. The gate stacks 142, 144, 146, 148 may be referred to as high-k metal gates (HKMG) because each gate stack comprises a high-k dielectric (e.g., high-k dielectric layer 134) and a metal (e.g., oxygen-gettering conductive layer 138).

Figure 8:
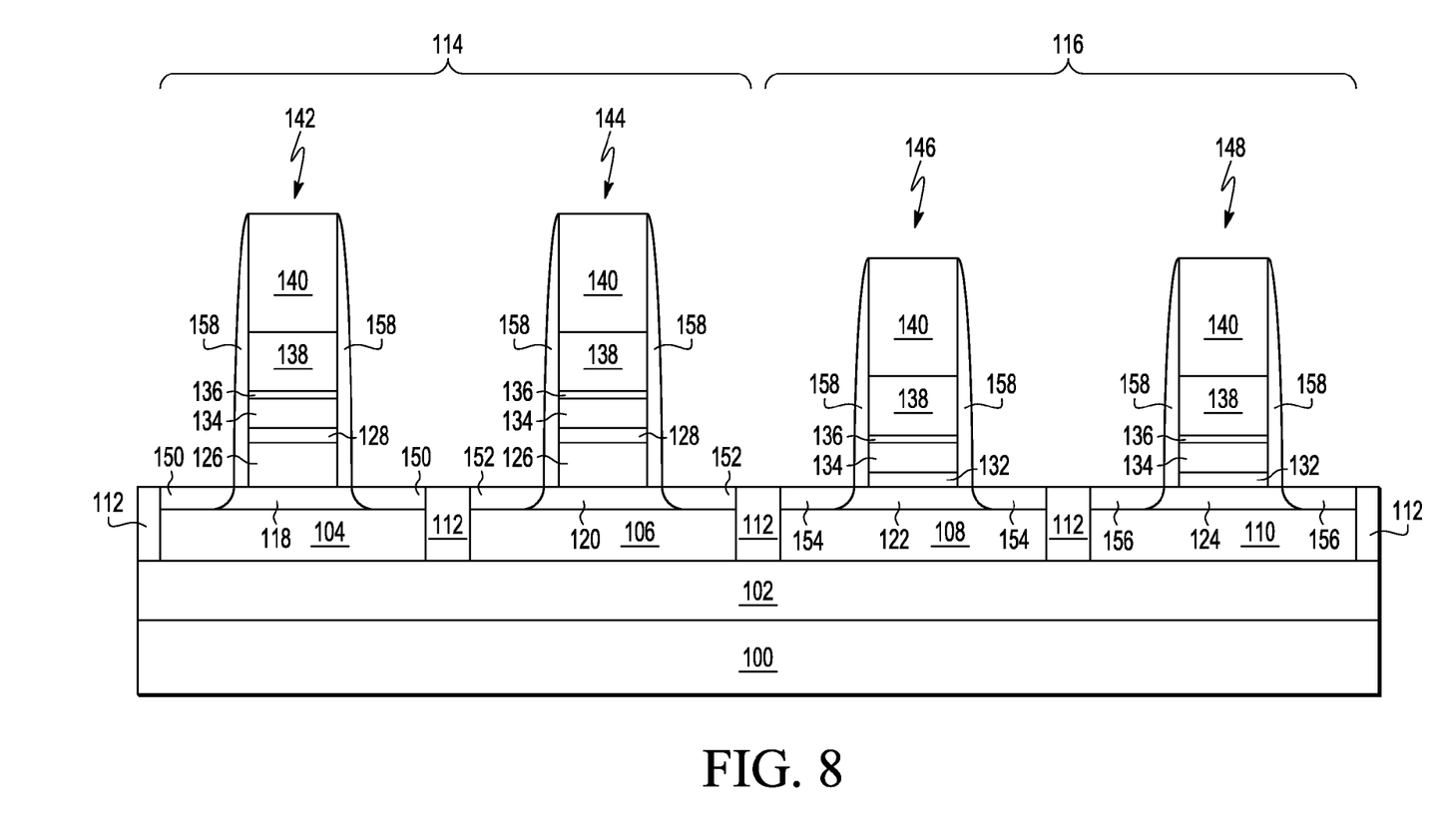

Referring now to FIG. 8, in an exemplary embodiment, the fabrication process continues by forming spaced-apart source and drain regions 150, 152, 154, 156 about the gate stacks 142, 144, 146, 148 by appropriately impurity doping the regions 104, 106, 108, 110 in a known manner, for example, by ion implantation of dopant ions and subsequent thermal annealing. In this regard, the barrier layer 128 prevents diffusion of deposited oxide material from the thick oxide layer 126 to the oxygen-gettering conductive layer 138 during thermal annealing. In an exemplary embodiment, spacers 158 are formed about sidewalls of the gate stacks 142, 144, 146, 148 in a conventional manner. After forming sidewall spacers 158, source and drain regions 152, 156 are formed by implanting P-type ions (e.g., boron fluoride ($BF_2^+$) ionized species or boron ions) into regions 106, 110 by masking regions 104, 108 and using the gate stacks 144, 148 and sidewall spacers 158 as an implantation mask to create a PMOS I/O transistor structure having a thick oxide layer 126 on region 106 and a PMOS logic transistor structure having a thin oxide layer 132 on region 110. Similarly, source and drain regions 150, 154 are formed by implanting N-type ions (e.g., arsenic ions or phosphorus ions) into regions 104, 108 by masking regions 106, 110 and using the gate stacks 142, 146 and sidewall spacers 158 as an implantation mask to obtain a NMOS I/O transistor structure having a thick oxide layer 126 on region 104 and a NMOS logic transistor structure having a thin oxide layer 132 on region 108. It should be noted that although not illustrated in FIG. 8, practical embodiments may utilize source and drain extension regions which may implanted into regions 104, 106, 108, 110 prior to formation of sidewall spacers 158 in a conventional manner, as will be appreciated in the art. Additionally, the depth of the source and drain regions 150, 152, 154, 156 may vary depending on the embodiment, and in some embodiments, the source and drain regions 150, 152, 154, 156 may extend to the bottom of regions 104, 106, 108, 110 (e.g., to the interface with insulating layer 102).

After formation of the source and drain regions, fabrication of the MOS devices can be completed using any number of known process steps, modules, and techniques. These additional steps are well known and, therefore, will not be described here.

One advantage of the fabrication process described above is that the high-k metal gate thick oxide I/O transistors have an oxygen-diffusion barrier layer that prevents oxygen from diffusing from the deposited gate oxide to an overlying oxygen-gettering conductive material, such as titanium nitride (TiN) or tantalum nitride (TaN). As result, the I/O transistor structures have substantially uniform oxide thickness resulting in less variation in gate leakage across the wafer and improved time-dependent dielectric breakdown (TDDB), as well as less variation in threshold voltage. The oxygen-diffusion barrier layer is formed overlying the deposited oxide layer and removed from the logic transistor regions at the same time as the deposited oxide is removed, and therefore, does not require any additional etching or photolithography steps. The thickness of the oxygen-diffusion barrier layer may be adjusted to satisfy the gate leakage, gate capacitance, and threshold voltage requirements of a particular application.

Devices and methods configured in accordance with example embodiments of the invention relate to:

An apparatus is provided for a transistor in accordance with one embodiment. The transistor comprises a gate stack overlying a semiconductor material. The gate stack comprises a deposited oxide layer overlying the semiconductor material, an oxygen-diffusion barrier layer overlying the deposited oxide layer, a high-k dielectric layer overlying the oxygen-diffusion barrier layer, and an oxygen-gettering conductive layer overlying the high-k dielectric layer. The oxygen-diffusion barrier layer prevents diffusion of oxygen. In accordance with one embodiment, the deposited oxide layer has a thickness of at least 1 nanometer. In a further embodiment, the deposited oxide layer comprises a layer of silicon dioxide deposited on the semiconductor material. In another embodiment, the oxygen-diffusion barrier layer has a thickness between 0.1 nm and 1.5 nm. In accordance with another embodiment, the oxygen-diffusion barrier layer comprises a layer of material selected from a group consisting of aluminum nitride, silicon nitride, and germanium nitride. In accordance with yet another embodiment, the oxygen-gettering conductive layer comprises a metal. In another embodiment, the oxygen-gettering conductive layer comprises a material selected from a group consisting of titanium nitride, tantalum nitride, and tungsten nitride. In accordance with one embodiment, the semiconductor material includes a mobility-enhancing material, wherein the deposited oxide layer is deposited over the mobility-enhancing material.

In accordance with one embodiment, a method is provided for fabricating a transistor. The method comprises depositing an oxide layer overlying a layer of semiconductor material, forming an oxygen-diffusion barrier layer overlying the oxide layer, and forming a layer of high-k dielectric material overlying the oxygen-diffusion barrier layer. The method further comprises forming a layer of conductive material overlying the layer of high-k dielectric material and selectively removing portions of the layer of conductive material, the layer of high-k dielectric material, the oxygen-diffusion barrier layer, and the oxide layer to form a gate stack, and forming source and drain regions about the gate stack. In accordance with one embodiment, depositing the oxide layer comprises depositing an oxide material at a temperature between 700° C. and 1000° C. In a further embodiment, depositing the oxide material comprises depositing the oxide material with a thickness of at least 1 nm. In accordance with another embodiment, the layer of semiconductor material includes a layer of mobility-enhancing material, wherein the oxide material is deposited on the mobility-enhancing material. In accordance with another embodiment, forming the oxygen-diffusion barrier layer comprises forming a layer of a material selected from the group consisting of silicon nitride, aluminum nitride, and germanium nitride. In a further embodiment, forming the layer of conductive material comprises forming a metal layer. In accordance with another embodiment, the method further comprises forming a capping layer overlying the layer of high-k dielectric material, wherein selectively removing portions of the layer of conductive material, the layer of high-k dielectric material, the oxygen-diffusion barrier layer, and the oxide layer also removes a portion of the capping layer to form the gate stack.

In accordance with another embodiment, a method is provided for fabricating a semiconductor device including a first transistor and a second transistor. The method comprises providing a semiconductor device structure having a first region of semiconductor material and a second region of semiconductor material, depositing a first oxide layer overlying the first region and the second region and forming an oxygen-diffusion barrier layer overlying the first oxide layer. The method further comprises removing the oxygen-diffusion barrier layer and the first oxide layer overlying the second region, while leaving intact the oxygen-diffusion barrier layer and the first oxide layer overlying the first region. The method further comprises forming a dielectric layer overlying the second region. The first oxide layer has a first thickness and the dielectric layer has a second thickness, wherein the second thickness is less than the first thickness. The method further comprises forming a layer of high-k dielectric material overlying the oxygen-diffusion barrier layer of the first region and the dielectric layer of the second region, and forming a layer of conductive material overlying the layer of high-k dielectric material. The method further comprises selectively removing portions of the layer of conductive material, the layer of high-k dielectric material, the oxygen-diffusion barrier layer, and the first oxide layer overlying the first region to form a first gate stack for the first transistor and selectively removing portions of the layer of conductive material, the layer of high-k dielectric material, and the dielectric layer overlying the second region to form a second gate stack for the second transistor. In accordance with one embodiment, the first transistor comprises an I/O transistor and the second transistor comprises a logic transistor. In accordance with another embodiment, forming the dielectric layer comprises growing a second oxide layer. In a further embodiment, growing the second oxide layer comprises performing a chemical clean of the semiconductor device structure using an oxidizing substance. In accordance with yet another embodiment, the first region of semiconductor material includes a mobility-enhancing material, wherein the first oxide layer is deposited on the mobility-enhancing material.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device comprising:
a semiconductor device structure having a first region of a first semiconductor material and a second region of a second semiconductor material;
a first transistor comprising:
a first layer of a mobility-enhancing material in the first region; and
a first gate stack overlying the first layer, the first gate stack comprising:
a deposited oxide layer overlying the first layer, the deposited oxide layer having a first thickness,
an oxygen-diffusion barrier layer overlying the deposited oxide layer,
a first portion of a layer of high-k dielectric material overlying the oxygen-diffusion barrier layer, and
a first portion of a layer of conductive material overlying the first portion of the layer of high-k dielectric material, wherein sidewalls of the first portion of the layer of conductive material, sidewalls of the first portion of the layer of high-k dielectric material, and sidewalls of the oxygen-diffusion barrier layer of the first gate stack are vertically aligned; and
a second transistor comprising:
a second layer of the mobility-enhancing material in the second region; and
a second gate stack overlying the second layer, the second gate stack comprising:
an oxide layer overlying the second layer, the oxide layer having a second thickness, the second thickness being less than the first thickness,
a second portion of the layer of high-k dielectric material overlying the oxide layer of the second region, and
a second portion of the layer of conductive material overlying the second portion of the layer of high-k dielectric material.

2. The semiconductor device of claim 1, wherein the first transistor comprises an I/O transistor and the second transistor comprises a logic transistor.

3. The semiconductor device of claim 1, wherein the oxide layer comprises a nitrided oxide.

4. A transistor comprising:
a region of semiconductor material;
a layer of a mobility-enhancing material in the region of semiconductor material; and
a gate stack overlying the region of semiconductor material, the gate stack comprising:
    a deposited oxide layer on the layer of the mobility-enhancing material;
    an oxygen-diffusion barrier layer overlying the deposited oxide layer, the oxygen-diffusion barrier layer preventing diffusion of oxygen;
    a high-k dielectric layer overlying the oxygen-diffusion barrier layer; and
    an oxygen-gettering conductive layer overlying the high-k dielectric layer.

5. The transistor of claim 4, wherein the deposited oxide layer comprises an oxide material having a thickness greater than 1 nm.

6. The transistor of claim 5, wherein the thickness is in the range of 1 nm to 7 nm.

7. The transistor of claim 4, wherein the mobility-enhancing material comprises silicon germanium.

8. The transistor of claim 4, wherein the oxygen-diffusion barrier layer comprises a material chosen from silicon nitride, aluminum nitride, and germanium nitride.

9. The transistor of claim 4, wherein the oxygen-gettering conductive layer comprises a metal nitride material.

10. The transistor of claim 9, wherein the gate stack further comprises a layer of polycrystalline silicon overlying the metal nitride material.

* * * * *